United States Patent
Kusunoki et al.

(10) Patent No.: US 9,260,780 B2
(45) Date of Patent: Feb. 16, 2016

(54) PROCESS FOR FORMING THIN FILM AND SYSTEM FOR FORMING THIN FILM

(75) Inventors: Masanobu Kusunoki, Wakayama (JP); Keitaro Harada, Yamagata (JP); Masayoshi Yokoo, Yamagata (JP); Yoshinobu Takano, Yamagata (JP)

(73) Assignee: TOHOKU SEIKI INDUSTRIES, LTD., Yamagata (JP)

( * ) Notice: Subject to any disclaimer, the term of this patent is extended or adjusted under 35 U.S.C. 154(b) by 2259 days.

(21) Appl. No.: 10/594,153

(22) PCT Filed: Mar. 26, 2004

(86) PCT No.: PCT/JP2004/004356
§ 371 (c)(1),
(2), (4) Date: Aug. 6, 2007

(87) PCT Pub. No.: WO2005/093123
PCT Pub. Date: Oct. 6, 2005

(65) Prior Publication Data
US 2008/0076269 A1    Mar. 27, 2008

(51) Int. Cl.
*C23C 14/54*    (2006.01)
*C23C 14/22*    (2006.01)
(Continued)

(52) U.S. Cl.
CPC .............. *C23C 14/541* (2013.01); *C23C 14/225* (2013.01); *C23C 14/34* (2013.01);
(Continued)

(58) Field of Classification Search
CPC .. C23C 14/225; C23C 14/34; C23C 14/3464; C23C 14/541; C23C 14/505; H01J 37/3447; H01J 37/3402

USPC .......... 204/298.04, 192.24; 505/475; 118/730
See application file for complete search history.

(56) References Cited

U.S. PATENT DOCUMENTS 4,882,023 A * 11/1989 Wendman ...................... 427/531
4,923,585 A *  5/1990 Krauss et al. ............. 204/298.04
(Continued)

FOREIGN PATENT DOCUMENTS

JP         60-026661        2/1985
JP          7-75689         8/1995
(Continued)

OTHER PUBLICATIONS

"In situ grown $YBa_2Cu_3O_{7-d}$ thin films from single-target magnetron sputtering" by C.B. EOm, el al. Appl. Phys. Lett. 55 (6), Aug. 7, 1989. pp. 595-597.

*Primary Examiner* — Michael Band
(74) *Attorney, Agent, or Firm* — Mattingly & Malur, PC

(57) ABSTRACT

This is a thin film forming apparatus which is equipped with a target constructed of a thin film material, a cathode for generating a particulate thin film material from the target, a supporting member for supporting the substrate on which the particulate thin film material is to be deposited, a heater for heating the substrate, and a guide for introducing the particulate thin film material onto a surface of the substrate where the thin film material is deposited, wherein the supporting member supports the substrate so as to expose the first principal surface and its backside (second principal surface) of the substrate, the target is disposed in a position for producing the particulate thin film material in an extension of the first principal surface of the substrate, and the guide is disposed on the first principal surface and the second principal surface of the substrate.

4 Claims, 10 Drawing Sheets

(51) Int. Cl.
*C23C 14/34* (2006.01)
*C23C 14/50* (2006.01)
*H01J 37/34* (2006.01)

(52) U.S. Cl.
CPC ........... *C23C14/3464* (2013.01); *C23C 14/505* (2013.01); *H01J 37/3402* (2013.01); *H01J 37/3447* (2013.01)

(56) References Cited

U.S. PATENT DOCUMENTS

| 5,183,510 | A | * | 2/1993 | Kimura | 118/719 |
| 5,421,973 | A | * | 6/1995 | Koo et al. | 204/192.15 |
| 5,439,877 | A | * | 8/1995 | Face | 505/475 |
| 5,556,472 | A | * | 9/1996 | Nakamura et al. | 118/719 |
| 5,624,722 | A | * | 4/1997 | Nagaishi et al. | 427/586 |
| 6,057,271 | A | * | 5/2000 | Kenjiro et al. | 505/475 |
| 6,121,630 | A | * | 9/2000 | Itozaki et al. | 257/33 |
| 6,280,580 | B1 | | 8/2001 | Suh et al. | |
| 6,805,916 | B2 | * | 10/2004 | Cadieu | 427/475 |

FOREIGN PATENT DOCUMENTS

| JP | 8-078338 | 3/1996 |
| JP | 2000-045072 | 2/2000 |

* cited by examiner

PROCESS FOR FORMING THIN FILM AND SYSTEM FOR FORMING THIN FILM

TECHNICAL FIELD

The present invention relates to a thin film forming method and a thin film forming apparatus, and in particular, to a technology which is effectively applied to a method of forming a thin film comprised of an oxide superconductor.

BACKGROUND ART

Conventionally, as a method of forming a thin film on a dielectric, silicon, or other substrate, for example, there is a thin film forming method by making a material of the thin film (hereafter, this is called a thin film material) into particulates, and making the particulate thin film material on the substrate. As the thin film forming methods, depending on difference between methods of making the thin film material into particulates, methods of making it deposited, and the like, for example, there are a sputtering method, a CVD (Chemical Vapor Deposition) method, an MBE (Molecular Beam Epitaxy) method, a laser ablation method, a vacuum deposition method, etc.

In addition, generally, thin film forming systems which are used when forming a thin film using the sputtering method etc. are classified into systems called a parallel plate type and an opposed type according to positional relation between a substrate, on which the thin film is formed, and a target for generating the particulate thin film material.

The parallel plate type thin film forming apparatus is arranged, for example, as shown in FIG. 13, so that a first principal surface 1A of the substrate 1, and the target 2B may be in parallel. At this time, the target 2B is mounted on a cathode 3, and by supplying electric power to the cathode 3, the particulate thin film material 2A is sputtered out of the target 2B between the target 2B and the substrate 1. Then, for example, by applying an electric field between the target 2B and the substrate 1, introducing the particulate thin film material 2A in a direction of the substrate 1 with accelerating it, and depositing the particulate thin film material 2A on the first principal surface 1A of the substrate 1, the thin film 2 is formed. In addition, at this time, the substrate 1 is fixed to a heat stage 13, and is heated from a backside 1B of the first principal surface 1A of the substrate 1 (hereafter, this is called a second principal surface) as shown in FIG. 13.

In the case of the parallel plate type thin film forming apparatus, the particulate thin film material 2A which is accelerated and is in a high energy state collides at a nearly vertical angle to the thin film formation surface of the substrate. Therefore, while the film formation speed of the thin film 2 is fast and productive efficiency is high, there is a problem that a damage to the surface of the thin film 2 deposited on the substrate 1 is serious. In order to make the damage to the surface of the thin film 2 small, for example, there is a method of making an acceleration of the particulate thin film material 2A small. Nevertheless, when an acceleration of the particulate thin film material 2A is made small, film formation speed of the thin film 2 drops, and productive efficiency drops. Then, in recent years, for example, the opposed type thin film forming apparatus is proposed as a thin film forming apparatus which replaces the parallel plate type thin film forming apparatus.

The opposed type thin film forming apparatus is arranged, for example, as shown in FIG. 14, so that two targets 2B may face each other on an extension in a direction parallel to an in-plane direction of the first principal surface 1A of the substrate 1. Also at this time, the each target 2B is mounted on a cathode 3, and by supplying electric power to the cathode 3, the particulate thin film material 2A is sputtered out of the targets 2B. Since the particulate thin film material 2A which is sputtered out of the each target 2B gather between the two targets 2B facing each other, when the particulate thin film material 2A is accelerated by applying an electric field between the two targets 2B, and are introduced on the first principal surface 1A of the substrate 1, the thin film material 2 is formed by the particulate thin film material 2A being deposited on the first principal surface 1A of the substrate 1.

In the case of the opposed type thin film forming apparatus, since an incident angle at the time of the particulate thin film material 2A colliding with the first principal surface 1A of the substrate 1 is as small as about 0° to 45°, damage which the thin film 2 deposited on the first principal surface 1A of the substrate 1 receives is small when the particulate thin film material 2A collides with the first principal surface 1A of the substrate 1. Therefore, since it is possible to introduce and deposit the particulate thin film material 2A on to the first principal surface 1A of the substrate 1 in a high energy state, and it is possible to form the thin film 2 damage of whose surface is small without reducing productive efficiency.

In addition, since other methods such as the CVD method, MBE method, laser ablation method, and other film formation methods also form a thin film with principles and apparatuses similar to the sputtering method, detailed description is omitted.

The parallel plate type and opposed type thin film forming systems are used, for example, when producing microwave devices such as a GPS (Global Positioning Systems) array antenna and a microwave integrated circuit. In the microwave device, for example, as shown in FIGS. 15 and 16, a circuit pattern 2C is provided on the first principal surface 1A of the substrate 1, and a ground plane 2D is provided on the second principal surface 1B of the substrate 1. Here, FIG. 16 is a sectional view taken on line D-D' in FIG. 15.

The microwave device is operated using a change of a magnetic field generated in connection with a leakage electric field generated between the circuit pattern 2C and the ground plane 2D, for example, as shown in FIG. 17. At this time, when the circuit pattern 2C and the ground plane 2D are oxide layer superconductors, for example, it is possible to obtain smaller surface resistance and higher operating characteristics in comparison with usual conductors. Therefore, recently, various microwave devices using the oxide superconductors have attracted attention (for example, refer to S. Ohshima, "High-temperature superconducting passive microwave devices, filters, and antennas", Supercond. Sci. Technol., 13, 2000, p. 103-108).

In a microwave device using the oxide superconductors, for example, a dielectric substrate such as magnesium oxide (MgO) or sapphire ($Al_2O_3$) is used for the substrate 1, and oxide superconductors such as YBCO or BSCCO are used for the circuit pattern 2C and the ground plane 2D.

When producing a microwave device using the oxide superconductors, first, as shown in FIG. 18, thin films 2C' and 2D' of the oxide superconductors are formed on the first principal surface 1A and the second principal surface 1B of the dielectric substrate 1, respectively. The parallel plate type and opposed type thin film forming apparatuses are used for formation of the thin films 2C' and 2D. At this time, it is assumed that the target 2B is constructed of, for example, a material of $YBa_2CU_3O_x$, $Y_2O_3$, BaO, CuO, or the like which is used for formation of YBCO which is one kind of oxide superconductors. In addition, the dielectric substrate 1 is heated at, for example, about 800° C. at this time.

In addition, when forming the thin films 2C' and 2D, for example, after forming the thin film 2C' on the first principal surface 1A of the dielectric substrate 1, the dielectric substrate 1 is turned over, and the thin film 2D on the second principal surface 1B of the dielectric substrate 1 is formed. At this time, respective thin films 2C' and 2D on the first principal surface 1A and second principal surface 1B of the dielectric substrate 1 are formed with composition of target 2B and conditions in an apparatus at the time of formation being fixed, for example, so as to become the same film quality and film thickness.

Next, as shown in FIG. 19, an etching resist 12 matched with the circuit pattern 2C is formed on one thin film, for example, the thin film 2C' on the first principal surface 1A of the dielectric substrate 1. At this time, although illustration is omitted, a resist is formed, for example, also on the backside of the surface on which the etching resist 12 is formed, that is, the thin film 2D on the second principal surface 1B of the substrate 1. Then, unnecessary portions are removed by etching the thin film 2C' on the surface on which the etching resist 12 is formed, and the circuit pattern 2C as shown in FIG. 15 is formed.

Nevertheless, when forming the thin films 2 in both sides of the substrate 1 by the conventional art, it is necessary to form single sides separately. Therefore, for example, while turning the substrate 1 over and forming the thin film 2 on the second principal surface 1B of the substrate 1 after forming the thin film 2 on the first principal surface 1A of the substrate 1, film quality of the thin film 2 formed on the first principal surface 1A of the substrate 1 may change. In particular, when forming the thin films 2C' and 2D of the oxide superconductors like the microwave device, there was a problem that degradation of the film quality due to a timing change occurred easily.

In addition, even if thin films are formed under the same conditions using the same thin film forming apparatus, it is apt to generate difference between the film qualities of the thin film 2 formed at a time and the thin film 2 formed at a second time because of states of the target 2B, temperature unevenness at the time of heating, etc. Therefore, the conventional methods for forming a thin film had a problem that it was difficult to equalize the film qualities of the thin film of the first principal surface 1A and the thin film of the second principal surface 1B of the substrate 1.

In particular, the oxide superconductor used when producing the device is deficient in chemical stability. Therefore, when forming single sides separately at the time of forming the thin films 2C' and 2D of the oxide superconductor on both sides of the substrate 1, degradation of the film quality and decrease of uniformity of the thin film 2C' formed on the first principal surface 1A and the thin film 2D formed on the second principal surface 1B of the dielectric substrate 1 are apt to be generated. Therefore, for example, there was a problem that difference between electrical characteristics of the circuit pattern 2C, and electrical characteristics of the ground plane 2D arose and operation of the device became unstable.

In addition, upsizing of the substrate 1 used for manufacturing the microwave device etc. has been advancing recently. Therefore, when forming single sides separately at the time of forming thin films on both sides of the first principal surface 1A and the second principal surface 1B of the substrate 1, degradation and unevenness of film quality become remarkable. Furthermore, for example, there was a problem that time and energy consumption required for formation of the thin films increased.

Moreover, when the time required for the formation of the thin films became long, there was a problem that productive efficiency of the thin films dropped and manufacturing cost rose.

Hence, the present invention aims at providing a thin film forming method and a thin film forming apparatus which can reduce degradation and dispersion of film qualities of thin films of respective surfaces of the substrate when depositing a material, which is made into particulates, on both sides of a substrate, for example, when forming thin films of oxide superconductors or the like.

In addition, the present invention aims at providing a thin film forming method and a thin film forming apparatus which can reduce production cost at the time of forming thin films, such as oxides superconductors, on both sides of a substrate.

DISCLOSURE OF THE INVENTION

A thin film forming method of the present invention is a thin film forming method which makes a material (hereafter, this is called a thin film material), which becomes a source of thin films to be formed, particulate, introduces the particulate thin film material on a first principal surface and its backside (a second principal surface) of a substrate and deposits it on the substrate, and forms thin films. The thin film forming method is directed to exposing the first principal surface and the second principal surface of the substrate, and introducing the particulate thin film material including converging the particulate material and increasing its density when introducing it on the first principal surface and the second principal surface of the substrate. Thereby, it is possible to form thin films simultaneously on both sides of the first principal surface and the second principal surface of the substrate. Therefore, it is possible to reduce degradation of film quality due to a timing change and dispersion in the film quality due to a state or temperature unevenness of a target, and it is easy to equalize the film qualities of the thin films which are formed in both sides of the substrate.

In addition, since it is possible to form thin films simultaneously on both sides of the first principal surface and the second principal surface of the substrate, it is possible to reduce time and energy consumption which are required for formation of the thin films. Therefore, it is possible to improve productive efficiency and to reduce manufacturing cost.

Furthermore, it is possible to increase film formation speed of the thin films by introducing the particulate thin film material so that they may converge for their density to become high as they approach to the first principal surface and the second principal surface of the substrate. Therefore, the productive efficiency of the thin films is improved further.

Moreover, at this time, even when the density distribution of the particulate thin film material is uneven, it becomes easy to uniform film thickness of the thin films by depositing the thin film material with rotating the substrate with making a normal direction of the first principal surface as a rotation axis.

In addition, at this time, it is possible to reduce temperature unevenness of the substrate by arranging heaters in a position facing the first principal surface of the substrate and a position facing the second principal surface and heating the substrate. Therefore, it is possible to reduce dispersion in film qualities of the thin films.

Furthermore, it is preferable to use such a thin film forming method when forming thin films of oxide superconductors, which are deficient in chemical stability, such as YBCO, BSCCO, or the like. The oxide superconductor is apt to generate degradation and dispersion of film quality by a timing change. Therefore, by using the thin film forming method according to the present invention, it becomes possible to reduce the time required for formation of thin films and to reduce the degradation and dispersion of film qualities.

Moreover, a thin film forming apparatus of the present invention is a thin film forming apparatus comprising a target constructed of a material (thin film material) which becomes a source of thin films to be formed, a cathode for producing the material which is made particulate from the target, a supporting member for supporting the substrate on which the particulate material is deposited, a heater for heating the substrate, and a guide for introducing the particulate material onto the principal surface of the substrate, including converging the particulate material and increasing its density, wherein the supporting member supports the substrate so that the first principal surface and second principal surface may be exposed, and a guide is arranged in a position facing the first principal surface of the substrate and a position facing the second principal surface of the substrate. Thereby, since it is possible to form thin films simultaneously on both sides of the first principal surface and the second principal surface of the substrate, it is not only possible to reduce degradation of film quality, but also easy to uniform film qualities of thin films formed in respective principal surfaces of the substrate.

In addition, since it is possible to form thin films simultaneously on both sides of the substrate, it is possible to reduce time and energy consumption which are required for formation of the thin films. Therefore, it is possible to improve productive efficiency and to reduce manufacturing cost.

Furthermore, by arranging the guide, for example, it becomes possible to prevent a particulate thin film material from diverging when introducing the particulate thin film material, which is generated in a direction parallel to the first principal surface of the substrate, on the substrate. Therefore, it is easy to deposit a particulate thin film material on the substrate in comparison with a conventional opposed type thin film forming apparatus, and formation efficiency of thin films is improved.

Moreover, in such a thin film forming apparatus, it is preferable that the guide has an inclined portion spaced a distance from the substrate that becomes shorter in the direction of introducing the particulate thin film material. Furthermore, it is preferable to have a parallel portion, which is parallel to the first principal surface or the second principal surface of the substrate, in front of the inclined portion along the direction of introducing the particulate thin film material. At this time, the particulate thin film material is introduced along with the inclined portion on the first principal surface or the second principal surface of the substrate. Therefore, it becomes easy to introduce the particulate thin film material on the first principal surface and the second principal surface of the substrate with converging it and increasing density.

In addition, at this time, it is preferable that the supporting member is equipped with a rotating mechanism which rotates the substrate. Even in the case of introducing the particulate thin film conductor with converging it and making the density high with the guide, there is dispersion in the density of the particulate thin film conductor in the parallel portion and inclined portion of the guide. Therefore, by rotating the substrate by the rotating mechanism, it becomes possible to lessen an influence of the density dispersion of the particulate thin film conductor, and it becomes easy to uniform the film thickness of thin films to be formed.

Furthermore, at this time, the heater can reduce uneven heating of the substrate by, for example, being provided on a surface of the each guide which faces the substrate.

In addition, it is preferable that the target is arranged so that the particulate thin film material generated may be incident into the first principal surface and second principal surface of the substrate at an angle determined beforehand. At this time, when the incident angle at which the particulate thin film material is incident into (collides against) the first principal surface and second principal surface of the substrate is too large, damage to surfaces of the formed thin films is serious, and the surfaces become coarse. In addition, when the incident angle is too small, it is apt to be easy to be rejected when it is incident into (collides against) the first principal surface and second principal surface of the substrate, and film formation speed of the thin films drops. Therefore, it is preferable that the target is arranged so that the incident angle of the particulate thin film material may become, for example, 3° to 45°.

Furthermore, at this time, when dividing the target into several pieces, efficiency at the time of generating the particulate thin film material is improved, and it is possible to lower power consumption.

Moreover, although the thin film forming method and the thin film forming apparatus can be applied to various thin film formation regardless of kinds of the substrates and the thin film formation materials, in particular, it is preferable to be applied when forming thin films of oxide superconductors, which are deficient in chemical stability, such as YBCO or BSCCO. At this time, the target is constructed of a material used for formation of an oxide superconductor. Since an oxide superconductor is deficient in chemical stability, it is possible to reduce a change (degradation) and dispersion of film quality due to a timing change by forming thin films simultaneously on both sides of the first principal surface and the second principal surface of the substrate. Therefore, for example, by producing oxide superconductor thin films such as YBCO or BSCCO with applying the thin film forming method and the thin film forming apparatus according to the present invention when producing devices such as the microwave device, it is possible to reduce dispersion in the operating characteristics of the device, and the like.

BEST MODE FOR CARRYING OUT THE INVENTION

Figure 1:
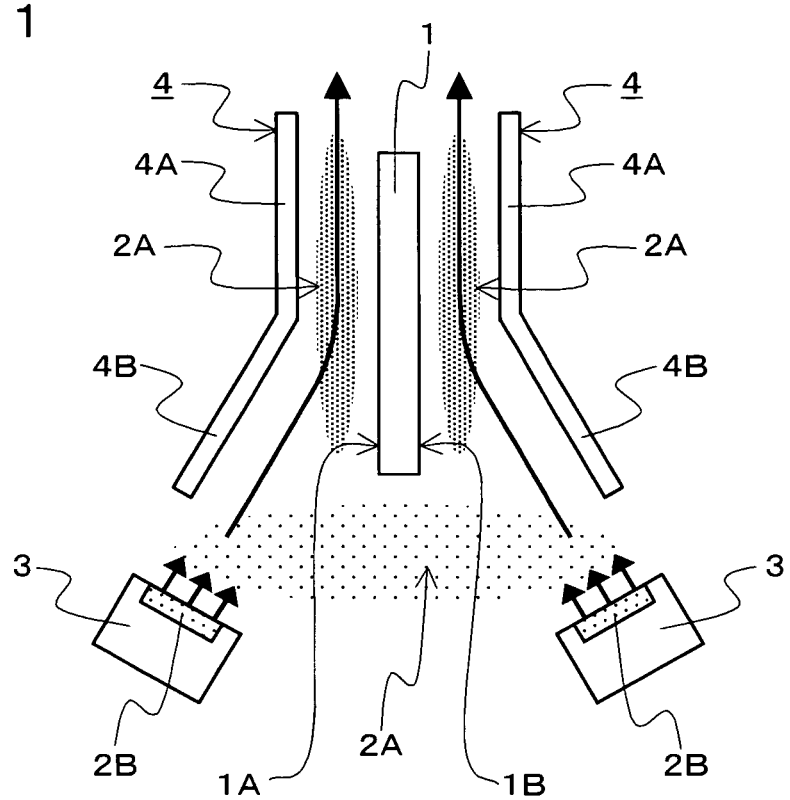
FIG. 1 is a schematic diagram for explaining a principle of a thin film forming method which is one embodiment according to the present invention.

In order to give explanation of the present invention in further detail, this will be explained according to attached drawings.

In addition, in all the drawings for explaining an embodiment, the same reference numerals are assigned to what have the same functions, and their repeated explanation is omitted.

In the thin film forming method which is the present invention, thin films are simultaneously formed on both sides of a top side and a backside of the substrate by supporting the substrate so that the top side (first principal surface) and backside (second principal surface) of the substrate may be exposed, introducing a particulate material, generated on an extension of the top side (or back side) of the substrate, and depositing it on the top side and back side of the substrate. In addition, at this time, thin film formation efficiency is increased by introducing the particulate material on the top side and back side of the substrate including converging the particulate material and increasing its density.

Embodiments

Figure 2:
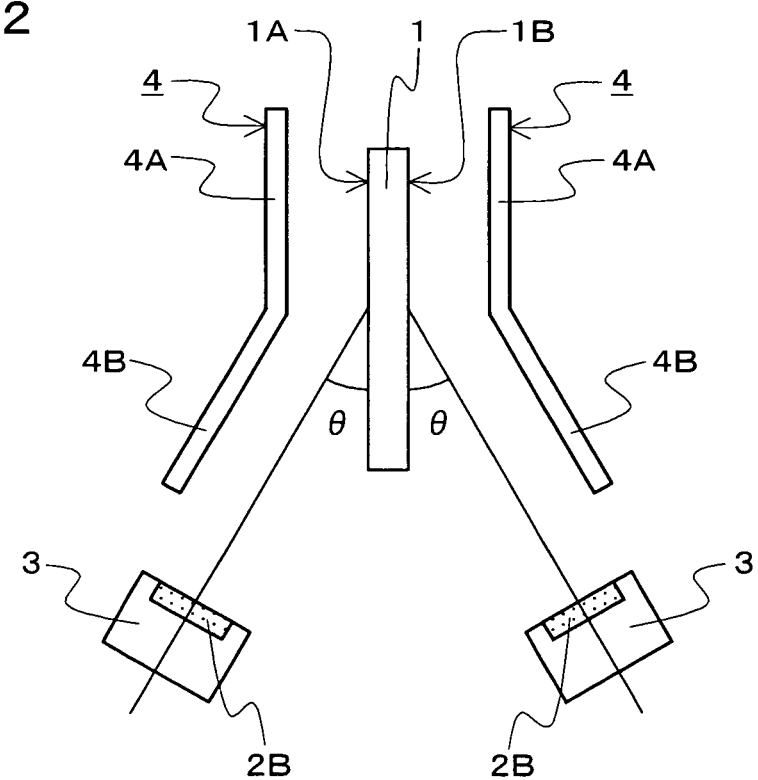
FIG. 2 is a schematic diagram for explaining a principle of a thin film forming method which is one embodiment according to the present invention.

FIGS. 1 and 2 are schematic diagrams for explaining a principle of a thin film forming method which is one embodiment according to the present invention.

In FIGS. 1 and 2, reference numeral 1 denotes a substrate, reference symbol 1A denotes a first principal surface of the substrate, reference symbol 1B denotes a second principal surface of the substrate, reference symbol 2A denotes a particulate thin film material, reference symbol 2B denotes a target, reference numeral 3 denotes a cathode, reference numeral 4 denotes a guide, reference symbol 4A denotes a parallel portion of the guide, and reference symbol 4B denotes an inclined portion of the guide. In addition, in FIG. 2, θ is an incident angle of the particulate thin film material.

The thin film forming method according to this embodiment is a forming method which uses, for example, a sputtering method, and as shown in FIG. 1, generates the particulate thin film material 2A in positions to which the first principal surface 1A and its backside (second principal surface) 1B is extended of the substrate 1 on which thin films are formed. At this time, the particulate thin film material 2A is generated from the target 2B, mounted on the cathode 3, for example as shown in FIG. 1. In addition, at this time, the cathode 3 on which the target 2B is mounted is arranged as shown in FIGS. 1 and 2 so that the particulate thin film material 2A generated from the target 2B may be incident into (collide against) the first principal surface 1A or the second principal surface 1B of the substrate 1 at an angle θ. The angle θ is made, for example, 3° to 45°.

At this time, when making the first principal surface 1A and the second principal surface 1B into states of being exposed by supporting the substrate 1 on end portions of the first principal surface 1A and the second principal surface 1B, and introducing the particulate thin film material 2A on the first principal surface 1A and the second principal surface 1B of the substrate 1, it is possible to form thin films simultaneously on both sides of the first principal surface 1A and the second principal surface 1B of the substrate 1.

In addition, at this time, as shown in FIGS. 1 and 2, when providing the guide 4, which has the parallel portion 4A parallel to the respective principal surfaces 1A and 1B, and the inclined portion 4B which is separate from the substrate 1 as it goes to the target 2B from the substrate 1, on the first principal surface 1A and the second principal surface 1B of the substrate 1, it is possible to increase density by converging the particulate thin film material 2A in process of introducing the particulate thin film material 2A to respective principal surfaces 1A and 1B of the substrate 1. Therefore, since film formation speed of thin films becomes high, it is possible to increase productive efficiency.

At this time, when a boundary between the parallel portion 4A and the inclined portion 4B of the guide 4 is on the substrate 1 as shown in FIG. 1, density of the thin film material 2A in a portion pinched by the parallel portion 4A is different from density of the thin film material 2A in a portion pinched by the inclined portion 4B, and hence, dispersion arises in film thickness. Hence, when the boundary between the parallel portion 4A and the inclined portion 4B of the guide 4 is on the substrate 1, for example, it is preferable to deposit the thin film material 2A with rotating the substrate 1.

In addition, when forming the thin films, generally, it is necessary to heat the substrate 1. Hence, for example, heaters (not shown) are provided in surfaces of the guide 4 which face the substrate 1 to heat the substrate 1. Also at this time, when the boundary between the parallel portion 4A and the inclined portion 4B of the guide 4 is on the substrate 1 as shown in FIG. 1, temperature of a portion pinched by the parallel portion 4A is different from temperature of a portion pinched by the inclined portion 4B, and hence, film qualities become uneven. Hence, when the boundary between the parallel portion 4A and the inclined portion 4B of the guide 4 is on the substrate 1, for example, it is preferable to deposit the thin film material 2A with rotating the substrate 1.

As explained above, by supporting the substrate 1, for example, so that the first principal surface 1A and the second principal surface 1B may be exposed, and introducing the particulate thin film material 2A, generated in the position to which the first principal surface 1A of the substrate is extended, toward the substrate 1 with accelerating it, the particulate thin film material 2A is introduced on both sides of the first principal surface 1A and second principal surface 1B of the substrate 1. Hence, it is possible to form thin films simultaneously on both sides of the first principal surface 1A and the second principal surface 1B of the substrate 1 respectively. Inconsequence, it is easy to provide uniform film qualities for both thin films formed on the first principal surface 1A and the second principal surface 1B of the substrate 1.

In addition, by providing the guide 4 to increase density of the thin film material 2A on the first principal surface 1A and the second principal surface 1B of the substrate 1, it is possible to prevent decease of film formation speed. In addition, since it is possible to form thin films simultaneously on the first principal surface 1A and the second principal surface 1B of the substrate, it is possible to reduce the time required for formation of the thin films.

Figure 3:
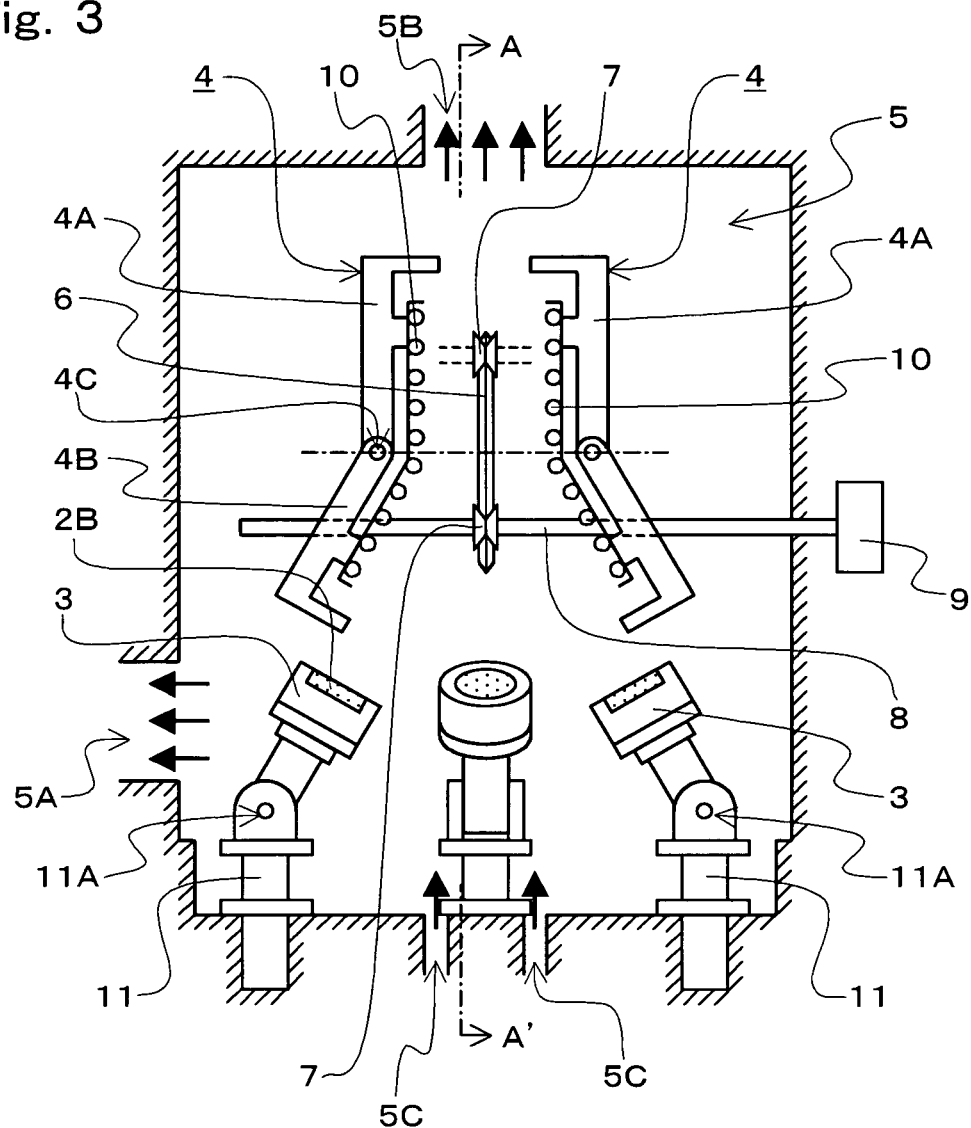
FIG. 3 is a schematic diagram showing schematic configuration of a thin film forming apparatus which achieves the thin film forming method according to this embodiment, and is a front view showing configuration of the system.
Figure 4:
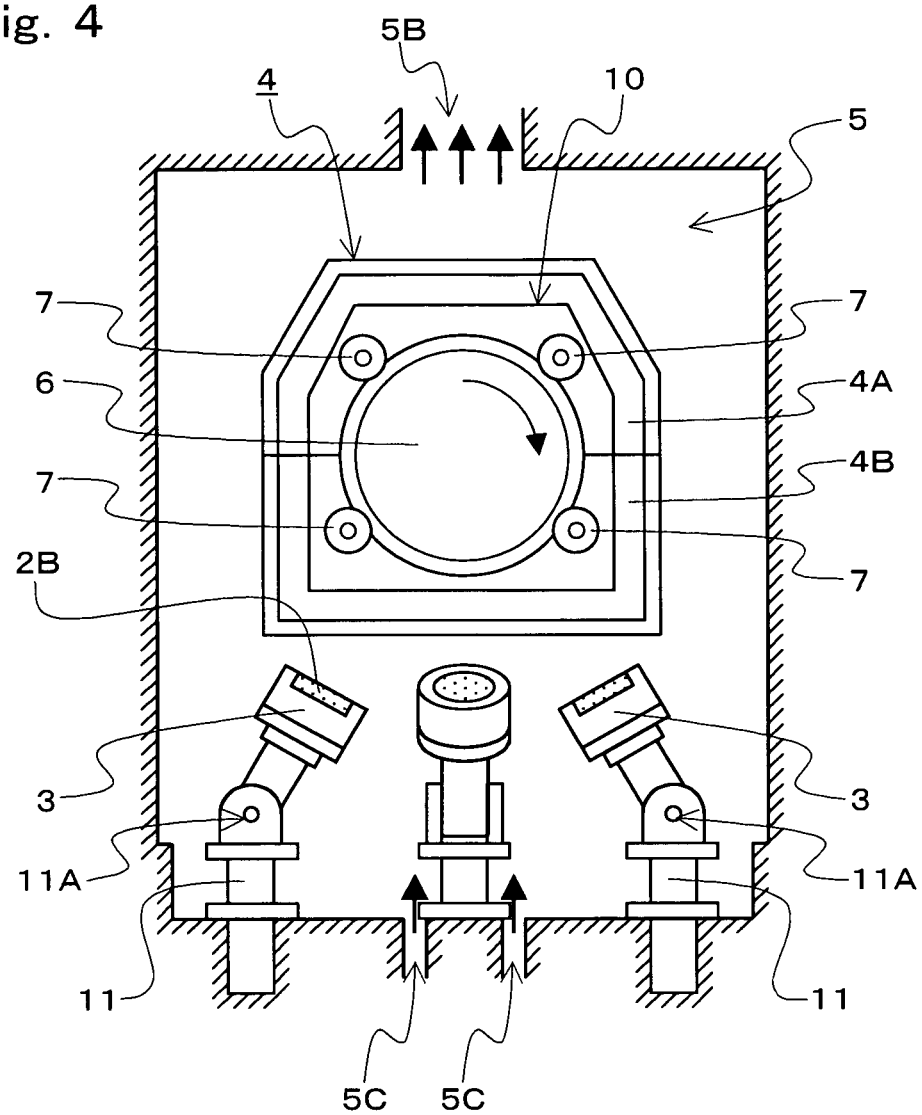
FIG. 4 is a schematic diagram showing schematic configuration of a thin film forming apparatus which achieves the thin film forming method according to this embodiment, and is a left side view taken on line A-A' in FIG. 3.
Figure 5:
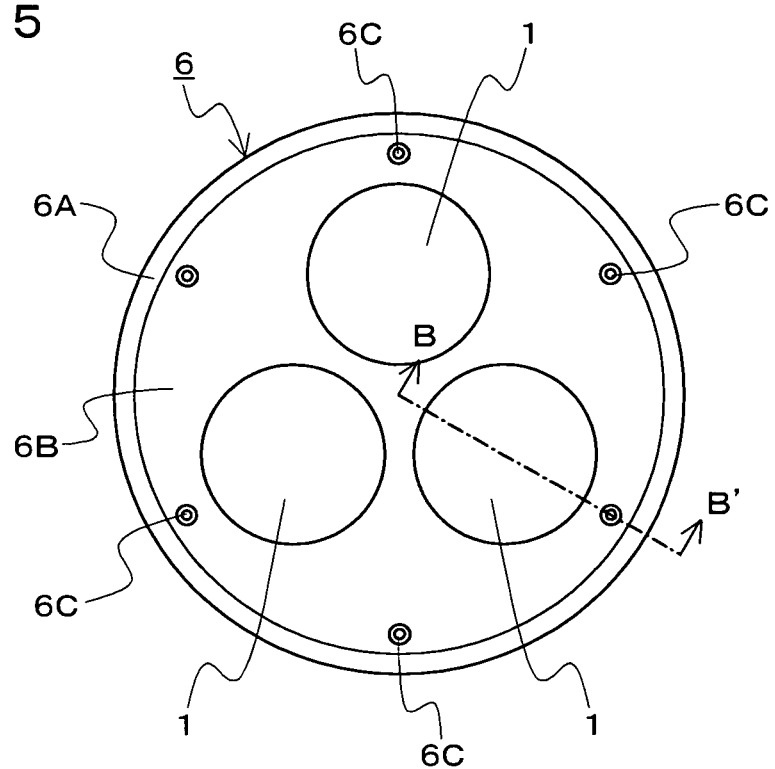
FIG. 5 is a schematic diagram showing schematic configuration of a thin film forming apparatus which achieves the thin film forming method according to this embodiment, and is a top view showing configuration of a substrate holder.
Figure 6:
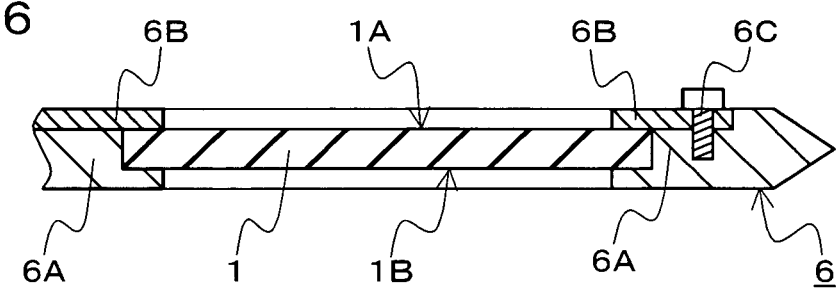
FIG. 6 is a schematic diagram showing schematic configuration of a thin film forming apparatus which achieves the thin film forming method according to this embodiment, and is a sectional view taken on line B-B' in FIG. 5.
Figure 7:
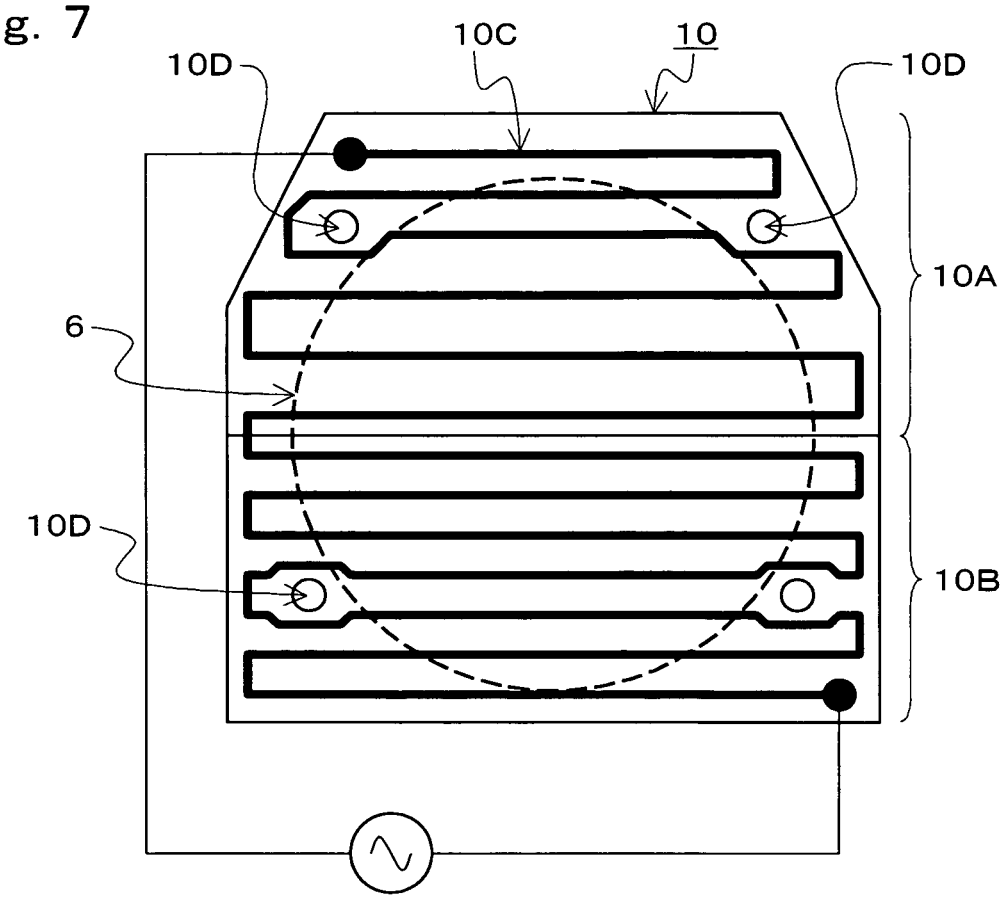
FIG. 7 is a schematic diagram showing schematic configuration of a thin film forming apparatus which achieves the thin film forming method according to this embodiment, and is a top view showing configuration of a heater.

FIGS. 3 to 7 are schematic diagrams showing schematic configuration of a thin film forming apparatus which achieves the thin film forming method according to this embodiment, FIG. 3 is a front view showing the configuration of the thin film forming apparatus, FIG. 4 is a left side view taken on line A-A' in FIG. 3, FIG. 5 is a top view showing configuration of a substrate holder, FIG. 6 is a sectional view taken on line B-B' in FIG. 5, and FIG. 7 is a top view showing configuration of a heater.

In FIG. 3 to FIG. 7, reference numeral 5 denotes a chamber, reference symbol 5A denotes a first exhaust port, reference symbol 5B denotes a second exhaust port, reference symbol 5C denotes a gas introducing pipe, reference numeral 6 denotes a substrate holder, reference symbol 6A denotes a first holder, reference symbol 6B denotes a second holder, reference symbol 6C denotes a screw, reference numeral 7 denotes a supporting member, reference numeral 8 denotes a drive shaft, reference numeral 9 denotes a motor, reference numeral 10 denotes a heater, reference symbol 10A denotes a parallel portion of the heater, reference symbol 10B denotes an inclined portion of the heater, reference symbol 10C denotes a heating wire, reference symbol 10D denotes a through hole, reference numeral 11 denotes a cathode mounting member, and reference symbol 11A denotes an angle controller.

In the thin film forming apparatus which achieves the thin film forming method according to this embodiment, as shown in FIGS. 3 and 4, for example, the supporting member 7 which supports the substrate holder 6 in which the substrate 1 is mounted, the cathode 3 in which the target 2B is mounted, and the guide 4 are provided inside the chamber 5. At this time, the substrate holder 6 is constructed of the first holder 6A and the second holder 6B, and the screws 6C which fasten and fix the first holder 6A, and the second holder 6B, as shown in FIGS. 5 and 6. In addition, at this time, as shown in FIG. 6, the substrate holder 6 supports end portions of the first principal surface 1A and the second principal surface 1B of the substrate 1 with the first holder 6A and, and the second holder 6B so that the first principal surface 1A and the second principal surface 1B may be exposed.

In addition, since being connected to, for example, the motor 9 with the drive shaft 8, the supporting member 7 is made to be able to rotate the substrate holder 6 with making a normal direction of the first principal surface 1A of the substrate 1 as a rotation axis in synchronization with rotation of the motor 9.

Furthermore, the guide 4 is constructed of the parallel portion 4A parallel to the substrate holder 6, and the inclined portion 4B which is separate from the substrate holder 6 as it goes to the cathode 3 from the substrate holder 6. At this time, it is assumed that the parallel portion 4A and the inclined portion 4B are connected in, for example, a rotary fulcrum portion 4C, and an angle formed by the parallel portion 4A and the inclined portion 4B is made to be controllable.

Moreover, the heaters 10 are provided on surfaces of the guide 4 which face the substrate holder 6. At this time, the heater 10 is constructed of, for example, the parallel portion 10A mounted on the parallel portion 4A of the heater 4, and the inclined portion 10B mounted on the inclined portion 4B of the heater 4 as shown in FIG. 7. In addition, at this time, an angle formed by the parallel portion 10A and the inclined portion 10B of the heater 10 is made, for example, so as to be interlocked with movement of the parallel portion 4A and the inclined portion 4B of the guide 4. In addition, the heating wire 10C provided in the parallel portion 10A of the heater 10 and the heating wire 10C provided in the inclined portion 10B of the heater 10 are made so that temperature difference between the parallel portion 10A and the inclined portion 10B may become small by changing density or the like. In addition, the through hole 10D through which the drive shaft 8 passes is also provided in the heater 10.

In addition, although illustration is omitted, the through hole through which the drive shaft 8 passes is also provided in the guide 4.

Furthermore, the cathode 3 is fixed to the chamber 5 with the cathode mounting member 11 as shown in FIGS. 3 and 4. At this time, the angle controller 11A which controls an angle of the cathode 3 is provided in the cathode mounting member 11.

When forming thin films on the first principal surface 1A and the second principal surface 1B of the substrate 1 using the thin film forming apparatus, for example, the substrate holder 6 is put inside the chamber 5 and is supported by the supporting member 7, and while the cathode 3 in which the target 2B is mounted is mounted in the chamber 5, the angles of the inclined portion 4B of the guide 4, the inclined portion 10B of the heater 10, and the cathode 3 are adjusted.

At this time, as shown in FIG. 2, the angle of the cathode 3 is adjusted so that an incident angle θ of the particulate thin film material 2A made to be sputtered from the target 2B mounted on the cathode 3 may become 15°. In addition, the angle between the inclined portion 4B of the guide 4 and the inclined portion 10B of the heater 10 is also adjusted so as to become 30° according to the incident angle θ of the particulate thin film material 2A.

Next, the inside of the chamber 5 is made into a vacuum state by not only sucking internal air out of the first exhaust port 5A and the second exhaust port 5B which are provided in the chamber 5, but also filling an argon gas or an oxygen gas inside the chamber 5 from the gas introducing pipe 5C provided in chamber 5.

Next, the substrate 1 mounted on the substrate holder 6 with the heater 10 is heated to the temperature, which was determined beforehand, with rotating the substrate holder 6.

Then, electric power is supplied to the cathode 3, and the particulate thin film material 2A is made to be sputtered from the target 2B. The particulate thin film material 2A made to be sputtered from the target 2B is introduced on the first principal surface 1A and the second principal surface 1B of the substrate 1, for example, according to the principle explained with using FIG. 1, and is deposited on the first principal surface 1A and the second principal surface 1B of the substrate 1.

Figure 8:
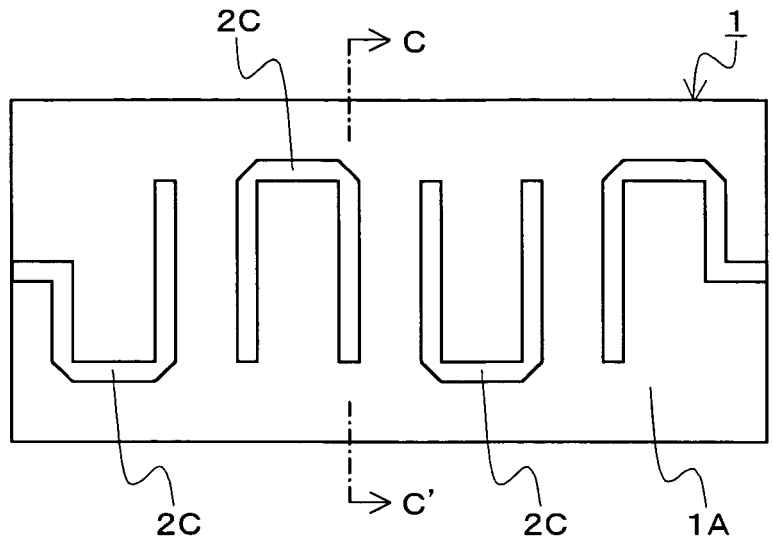
FIG. 8 is a schematic diagram for explaining an application example of the thin film forming method according to this embodiment, and is a top view showing an example of configuration of a microwave device.
Figure 9:
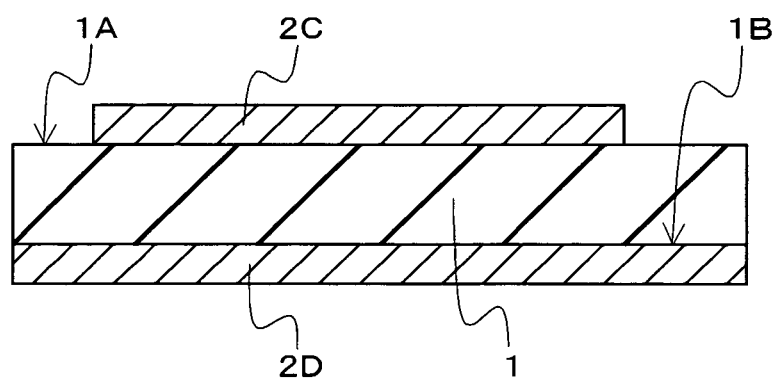
FIG. 9 is a schematic diagram for explaining an application example of the thin film forming method according to this embodiment, and is a sectional view taken on line C-C' in FIG. 8.
Figure 10:
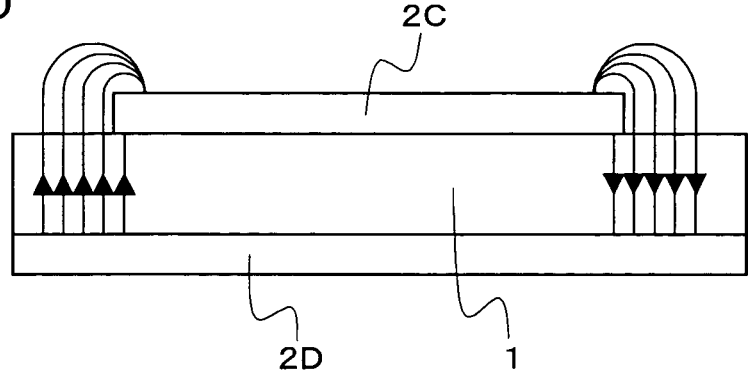
FIG. 10 is a schematic diagram for explaining an application example of the thin film forming method according to this embodiment, and is a diagram for explaining operation of the microwave device.
Figure 11:
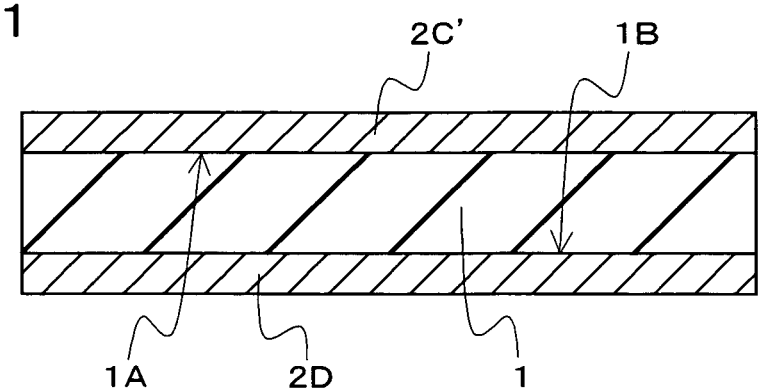
FIG. 11 is a schematic diagram for explaining an application example of the thin film forming method according to this embodiment, and is a sectional diagram for explaining a process for producing a microwave device.
Figure 12:
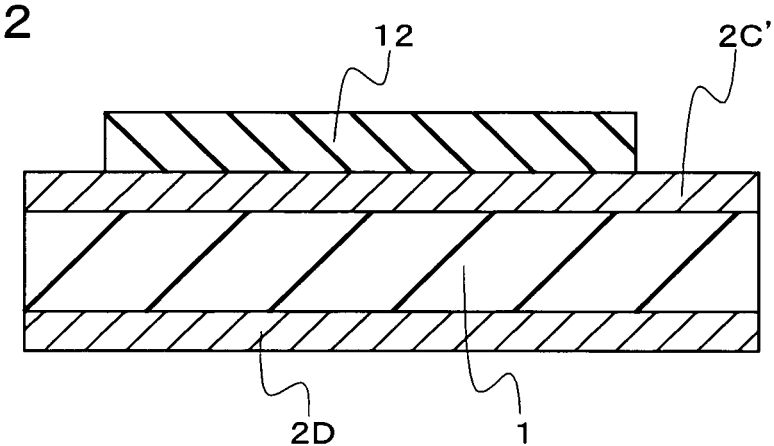
FIG. 12 is a schematic diagram for explaining an application example of the thin film forming method according to this embodiment, and is a sectional diagram for explaining a process for producing the microwave device.
Figure 13:
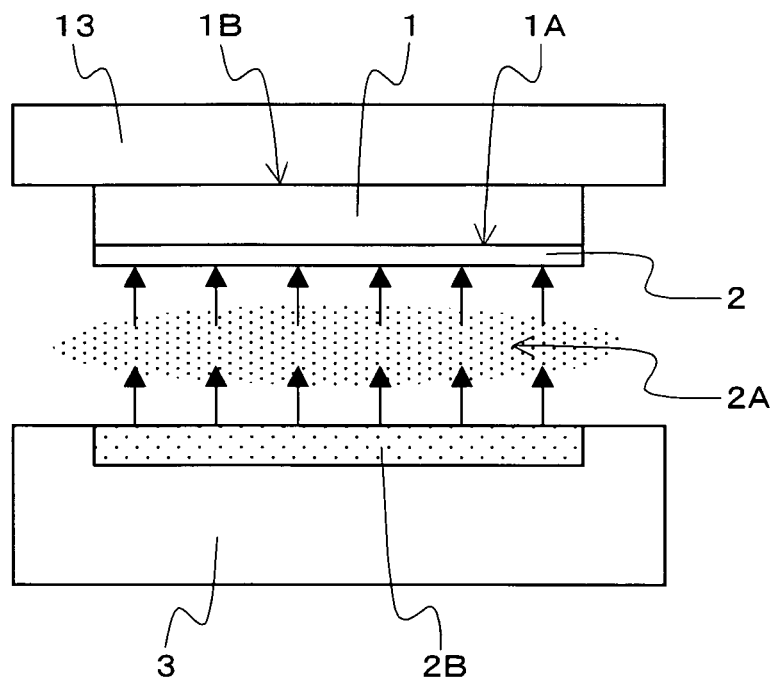
FIG. 13 is a schematic diagram for explaining a conventional thin film forming method, and is a diagram showing a process for formation which uses a parallel plate type system.
Figure 14:
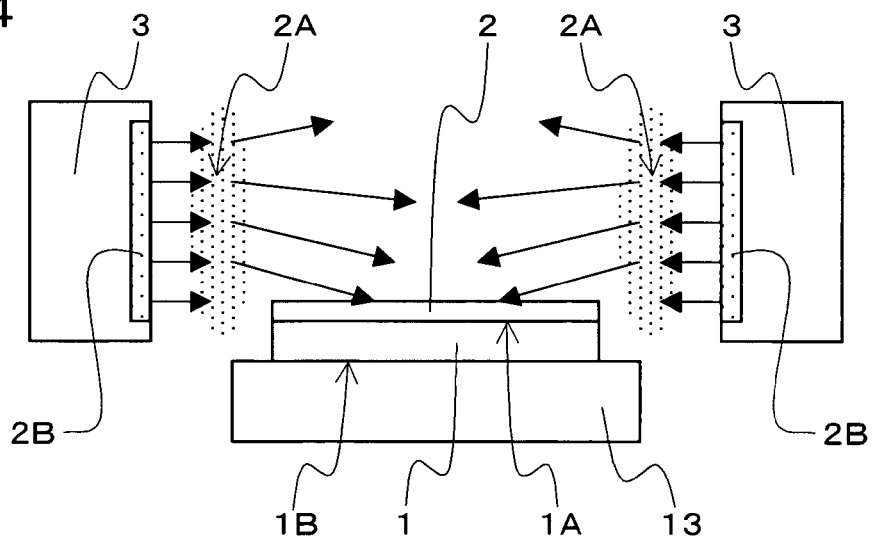
FIG. 14 is a schematic diagram for explaining a conventional thin film forming method, and is a diagram showing a process for formation which uses an opposed type system.
Figure 15:
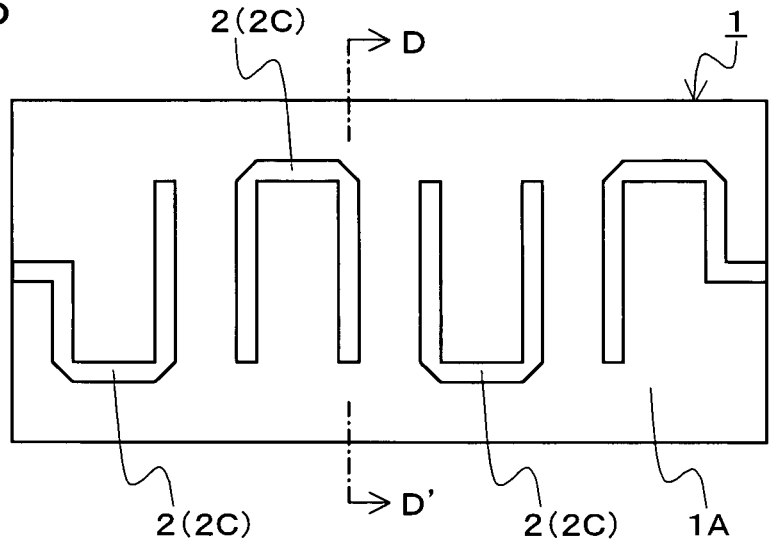
FIG. 15 is a schematic diagram for explaining an application example of a conventional thin film forming method, and is a top view showing an example of configuration of a microwave device.
Figure 16:
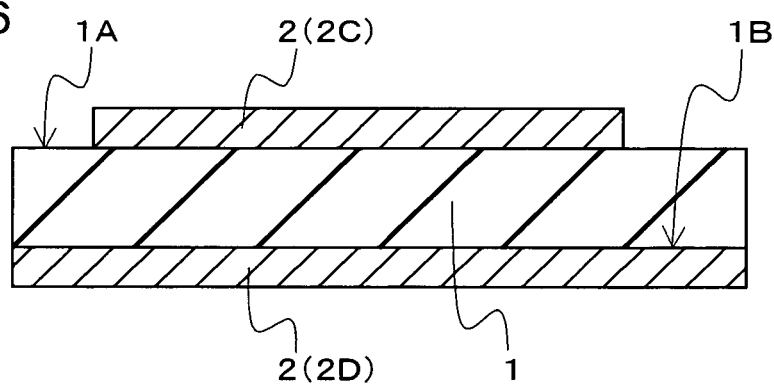
FIG. 16 is a schematic diagram for explaining an application example of the conventional thin film forming method, and is a sectional view taken on line D-D' in FIG. 15.
Figure 17:
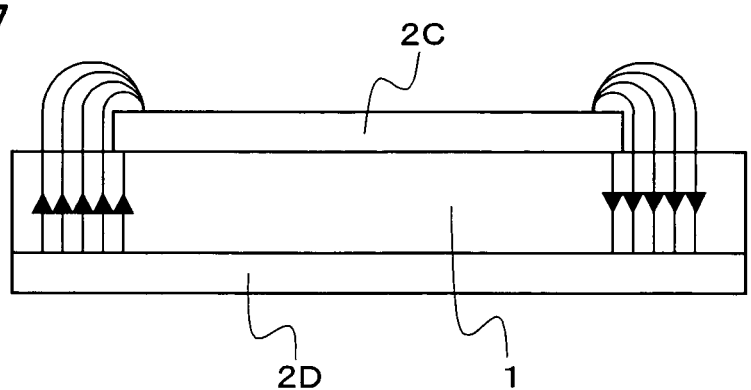
FIG. 17 is a schematic diagram for explaining an application example of the conventional thin film forming method, and is a diagram for explaining operation of the microwave device.
Figure 18:
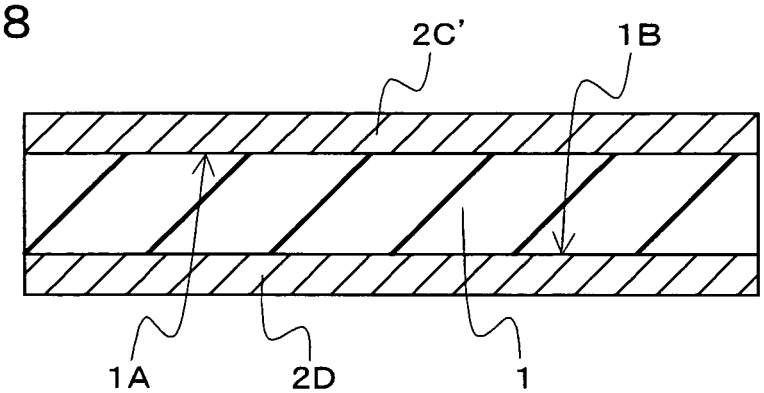
FIG. 18 is a schematic diagram for explaining an application example of the conventional thin film forming method, and is a sectional diagram for explaining a process for producing the microwave device.
Figure 19:
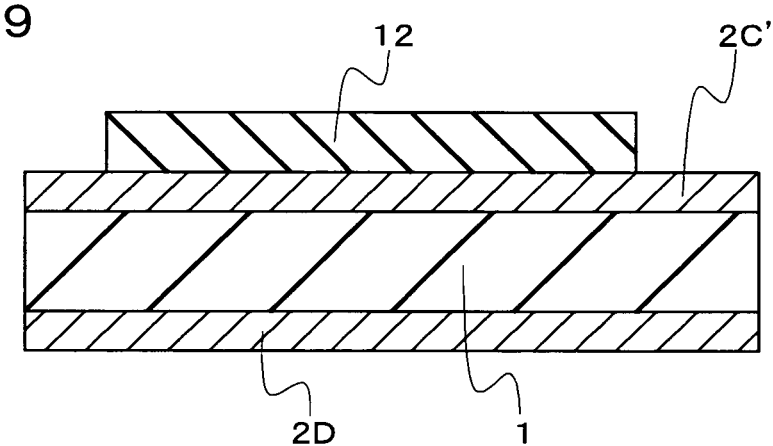
FIG. 19 is a schematic diagram for explaining an application example of the conventional thin film forming method, and is a sectional diagram for explaining a process for producing the microwave device.

FIGS. 8 to 12 are schematic diagrams for explaining application examples of the thin film forming method according to this embodiment, and FIG. 8 is a top view showing an example of configuration of a microwave device, FIG. 9 is a sectional view taken on line C-C' in FIG. 8, FIG. 10 is a diagram for explaining operation of the microwave device, and FIGS. 11 and 12 are sectional diagrams for explaining a process for producing a microwave device.

The thin film forming method according to this embodiment is used, for example as shown in FIGS. 8 and 9, for producing a microwave device in which the circuit pattern 2C is provided on the first principal surface 1A of the substrate 1, and a ground plane is provided on a backside (the second principal surface) 1B of the first principal surface 1A of the substrate 1. There are, for example, an array antenna, a microwave integrated circuit, a filter, and the like as the microwave devices.

The microwave device is operated using a change of a magnetic field generated in connection with a leakage electric field generated between the circuit pattern 2C and the ground plane 2D, for example, as shown in FIG. 10. At this time, when the circuit pattern 2C and the ground plane 2D are oxide layer superconductors, for example, it is possible to obtain smaller surface resistance and higher operating characteristics in comparison with usual conductors. Therefore, recently, various microwave devices using the oxide superconductors have attracted attention.

In a microwave device using the oxide superconductors, for example, a dielectric substrate such as magnesium oxide (MgO) or $Al_2O_3$ is used for the substrate 1, and oxide superconductors such as YBCO or BSCCO are used for the circuit pattern 2C and the ground plane 2D.

When producing a microwave device using the oxide superconductors, first, as shown in FIG. 11, thin films 2C' and 2D of the oxide superconductors are formed on the first principal surface 1A and the second principal surface 1B of the dielectric substrate 1. The thin film forming apparatus which is explained in this embodiment is used for formation of the thin films 2C' and 2D. At this time, for example, materials of $YBa_2CU_3O_x, Y_2O_3$, BaO, CuO and the like which are used for formation of YBCO which is one kind of oxide superconductors are used for the target 2B. In addition, the substrate 1 is made into a state of being heated at, for example, about 800° C.

Next, as shown in FIG. 12, an etching resist 12 matched with the circuit pattern 2C is formed on one thin film, for example, the thin film 2C' formed on the first principal surface 1A of the substrate 1. At this time, although illustration is omitted, a resist is formed, for example, also on the backside of the surface on which the etching resist 12 is formed, that is, the thin film 2D on the second principal surface 1B of the substrate 1. Then, unnecessary portions are removed by etching the thin film 2C' on the surface on which the etching resist 12 is formed, and the circuit pattern 2C as shown in FIG. 8 is formed.

At this time, since it was desired to form the thin films 2C' and 2D every one film in a conventional thin film forming apparatus, for example, degrees of timing changes of the thin film 2C' formed in the first time and the thin film 2D formed in the second time were different, and hence, film qualities of both the thin films 2C' and 2D were different in many cases. In particular, in the case of the thin films 2C' and 2D formed with using the oxide superconductors, since the oxide superconductors are deficient in chemical stability, degradation and dispersion of film qualities are remarkable. Therefore, it gives large influence to degradation of operating characteristics of a microwave device produced. On the other hand, in the thin film forming apparatus according to this embodiment, since it is possible to form thin films 2C' and 2D simultaneously on both sides of the first principal surface 1A and the second principal surface 1B of the substrate 1, it is possible to reduce degradation and dispersion in film qualities of the thin films 2C' and 2D on respective surfaces. Therefore, it is possible to stabilize the operating characteristics of the device.

As explained above, according to the thin film forming method according to this embodiment, since it is possible to form thin films 2C' and 2D simultaneously on both sides of the first principal surface 1A and the second principal surface 1B of the substrate 1, it is possible to reduce degradation and dispersion, caused by a timing change, in film qualities.

In addition, since it is possible to form thin films 2C' and 2D simultaneously on both sides of the first principal surface 1A and the second principal surface 1B of the substrate 1, it is possible to reduce time and energy consumption which are required for formation of the thin films. Therefore, it is possible to reduce production cost of the thin films.

Furthermore, since it is possible to form thin films 2C' and 2D simultaneously on both sides of the first principal surface 1A and the second principal surface 1B of the substrate 1, it is possible to reduce degradation of film qualities, caused by timing changes, also when forming thin films of the oxide superconductors. Therefore, it is possible to stabilize the operating characteristics of the microwave device using the oxide superconductors.

Moreover, when thin films are formed in a plurality of substrates 1 at once by using the thin film forming apparatuses as shown in FIGS. 3 and 4, or also when thin films are formed on the large-sized substrate 1, it is possible to reduce degradation and dispersion of film qualities and dispersion of film thickness.

As mentioned above, although the present invention is specifically explained on the basis of the embodiments, the present invention is not limited to the embodiments, but it is a matter of course that it can be modified variously within a range of not deviating from its gist.

For example, although the sputtering method is mentioned as the example and the principle and the configuration of the thin film forming apparatus are explained in the embodiment, it is not limited to this, but it is also possible to apply a CVD (Chemical Vapor Deposition) method, an MBE (Molecular Beam Epitaxy) method, a laser ablation method, a vacuum deposition method, etc. which use similar principles.

In addition, although the thin film forming method, which used an oxide superconductor, in the embodiments, it is not limited to this, but it is also possible to apply it regardless of kinds of materials so long as it is a thin film forming method which uses a similar principle and a similar system, for example, to formation of a thin film of a semiconductor or a metal.

Furthermore, although the heater 10 reduces temperature unevenness in the embodiments by changing density of the heating wires 10C of the parallel portion 10A and the inclined portion 10B as shown in FIG. 7, it is not limited to this, but for example, it is also satisfactory to reduce temperature unevenness by making the heating wire 10C of the parallel portion 10A and the heating wire 10C of the inclined portion 10B independent, and adjusting electric power applied to each. Furthermore, although the heaters 10 are provided in the surfaces of the guide 4 which faces the substrate holder 6 in the embodiments as shown in FIG. 3, it is not limited to this, but any kind of configuration and arrangement can be used so long as it is possible to heat uniformly the substrate 1 mounted on the substrate holder 6.

INDUSTRIAL APPLICABILITY

As described above, the thin film forming method and the thin film forming apparatus which relate to the present invention is useful as a thin film forming method by depositing a particulate material on a substrate, and in particular, it is suitable for production of a microwave device or the like to which stable operating characteristics are demanded.

The invention claimed is:

1. A thin film forming method which makes a material, which becomes a source of thin films to be formed, particulate, introduces and deposits the particulate material on a first principal surface and a second principal surface, opposite to said first principal surface, of a substrate, and forms thin films simultaneously on the first principal surface and the second principal surface of the substrate, comprising exposing the first principal surface and the second principal surface of the substrate, and introducing the particulate material with converging the particulate material and increasing the density of the particulate material by a first guide and a second guide for introducing particulate material on the first principal surface and the second principal surface of the substrate, the first guide being disposed at a position facing the first principal surface of the substrate and the second guide being disposed at a position facing the second principal surface of the substrate, and the first guide and the second guide respectively having an inclined portion separated by a distance from the substrate that decreases in the direction of introducing of the particulate thin film material.

2. The thin film forming method according to claim 1, further including depositing the particulate material while rotating the substrate about a rotational axis that is normal to the first principal surface.

3. The thin film forming method according to claim 1, further including arranging heaters in a position facing the first principal surface and a position facing the second principal surface of the substrate and heating the substrate.

4. The thin film forming method according to claim 1, further including generating the particulate material from a material used for formation of an oxide superconductor.

* * * * *